United States Patent [19]

Yoshida

[11] Patent Number: 4,654,812
[45] Date of Patent: Mar. 31, 1987

[54] SIMULATION SYSTEM
[75] Inventor: Fumio Yoshida, Hyogo, Japan
[73] Assignee: Mitsubishi Denki Kabushiki Kaisha, Tokyo, Japan
[21] Appl. No.: 640,745
[22] Filed: Aug. 14, 1984
[30] Foreign Application Priority Data Nov. 2, 1983 [JP] Japan .................. 58-206970

[51] Int. Cl.$^4$ .............. G06F 15/00; B21B 37/00
[52] U.S. Cl. .................. 364/578; 364/472; 72/11; 72/13
[58] Field of Search .............. 364/578, 469, 472, 150, 364/151; 72/11, 13, 24, 426; 371/23, 16, 17

[56] References Cited

U.S. PATENT DOCUMENTS

| 3,932,843 | 1/1976 | Trelut et al. | 371/23 |
| 4,342,093 | 7/1982 | Miyoshi | 371/23 X |
| 4,512,747 | 4/1985 | Hitchens et al. | 364/578 |
| 4,576,027 | 3/1986 | Yoshida et al. | 364/472 |

OTHER PUBLICATIONS

Automatic Control for Metal Rolling Mills: Technical Challenge with Time Limits—W. E. Miller, AIChE Symposium Series, No. 159, vol. 82, pp. 174–182.
Generation III Hot Strip Mill Automation System—Cullen and Petrus, Iron and Steel Engineer, Nov. 1979, pp. 25–30.
Electrical Equipment of Oita Works 88–In. Hot Strip Mill—Takigawa et al., Iron and Steel Engineer, Mar. 1974, pp. 33–40.

Primary Examiner—Parshotam S. Lall
Assistant Examiner—Thomas G. Black
Attorney, Agent, or Firm—Bernard, Rothwell & Brown

[57] ABSTRACT

A simulation system to make computers and automatic controllers for controlling the operation of a work processing system according to a predetermined sequence execute simulated control actions, having a unit which provides the logical sum of the output signals of detectors for detecting the work and simulation signals corresponding to the output signals of the detectors, and applies the simulation signals to the computers and the automatic controllers to made the computers and the automatic controllers execute real-time control actions.

7 Claims, 8 Drawing Figures

SIMULATION SYSTEM

BACKGROUND OF THE INVENTION

1. Field of the Invention

The present invention relates to a simulation system employed, for example, in an apparatus for rolling, cutting and carrying a work such as a slab.

A simulation system as applied to a hot strip mill system will be described hereinafter by way of example.

2. Description of the Prior Art

Referring to FIG. 1 showing the arrangement of a common hot strip mill system, a slab is carried by a heating furnace entry table 1, is fed into the heating furnace 2, and then is heated by the heating furnace 2. The heated slab is delivered onto and carried by a delivery table 3, and then is rolled by a rough rolling unit 4 consisting of a plurality of rolling mills and carrying tables connecting those rolling mills. Then, the heated slab is carried further by a delay table 5 and is rolled by a finish rolling unit 6 consisting of a plurality of rolling mills and the peripheral equipments. The slab thus rolled is carried by a runout table 7 to a coiler 8, which coils up the rolled slab in a coil. The coil formed by the coiler 8 is conveyed by a coil conveyor 9 to other equipment, for example, a cold strip mill system, not shown.

Recently, the following operations of the hot strip mill systems have remarkably been automated and hot strip mill systems are operated automatically by the use of automatic control systems including computers and plant controllers:

(1) Automatic start and automatic stop of carrying tables and automatic interlocked operation of carrying tables;

(2) Automatic start, automatic stop, acceleration and deceleration of rolling mills;

(3) Automatic operation of the screw-down device of rolling mills, particularly, the automatic control of draft;

(4) Automatic operation of side guide mechanism, particularly, the control of the opening of side guides;

(5) Automatic start, automatic stop, acceleration and deceleration of the coiler; and (6) Automatic operation of the coil conveyor.

In the above-mentioned automatic operations, basically, a computer calculates various objective values (including set values) for automatic operation upon the arrival of a slab at a predetermined position and sets the automatic controllers according to the calculated objective values so that each unit starts and completes an automatic operation in synchronism with the arrival of a slab at a predetermined position. Accordingly, it is essential to detect the arrival of a slab at a predetermined position for such an automatic operation. In order to detect the arrival of a slab at a predetermined position, a slab detector, for example, a HMD (Hot Metal Detector), and a detector for detecting metal-in to a mill are provided at predetermined positions to supply signals to the corresponding computers and automatic controllers.

In a recent hot strip mill system, increase in the number of items of automatic operation, the advancement and increase in precision of the control functions and increase in the number of controlled devices tend to require increased number of computers and automatic controllers to form a composite control system.

In such a composite control system, the advanced and complex functions of each controller and increased complexity of the system configuration require, as an essential condition, the confirmation of the general actions of the system in addition to the confirmation of the individual control functions and, in particular, a simulator capable of simulating the imaginary slab rolling conditions and the operation controlling conditions as efficient and effective means to confirm the actions of the strip mill system and the control functions.

There are known methods of simulation employing such a simulator; according to a method shown by the conceptional illustration of FIG. 2, the individual control functions of controllers Nos. 1 to 20 are confirmed by artificially applying simulation signals given by detectors, such as slab detectors, to the controllers, while according to a method shown in the conceptional illustration of FIG. 3, the individual control functions of computers Nos. 1 to 8 and automatic controllers Nos. 1 to 20 are confirmed by applying simulation signals given by OR gates Nos. 1 to 100 connected both to HMDs and simulation push buttons PB respectively.

These conventional methods of simulation, however, have the following disadvantages. The method of FIG. 2 is capable merely of confirming the control function of individual automatic controllers and is incapable of confirming the delicate interlocked control functions between the automatic controllers or between the automatic controllers and the computers. The method of FIG. 3 requires the manual operation of numerous simulation push buttons PB in a complicated and troublesome procedure. Furthermore, it is practically impossible to operate the push button PB in an appropriate timing according to the rolling and conveying of an optional number of slabs. Therefore, according to the conventional methods of simulation, the simulation of only a single and simple function is feasible.

SUMMARY OF THE INVENTION

Accordingly, it is an object of the present invention to provide a simulation system capable of confirming the functions of a total system by controlling computers or automatic controllers for controlling a material processing system so that the computers or the automatic controllers will make the real-time simulation of their control actions.

The present invention provides a simulation system for a work processing system having work processing equipments, a plurality of work detectors for detecting the existence of the work, and computers or automatic controllers adapted to control the work processing equipments sequentially in a predetermined order according to work detection signals given by the work detectors; comprising a simulation unit capable of real-time simulation of imaginary work processing operations, a signal generating unit capable of giving simulation signals corresponding to the ON-OFF signals of the work detectors according to the simulation mode of the simulation unit, and a circuit capable of providing the logical sums of the intrinsic work detection signals and the simulation signals of the work detectors; wherein the computers or the automatic controllers are actuated for the real-time simulation of the control actions by the simulation signals corresponding to the work detection signals of the work detectors.

DESCRIPTION OF THE PREFERRED EMBODIMENTS

Figure 4:
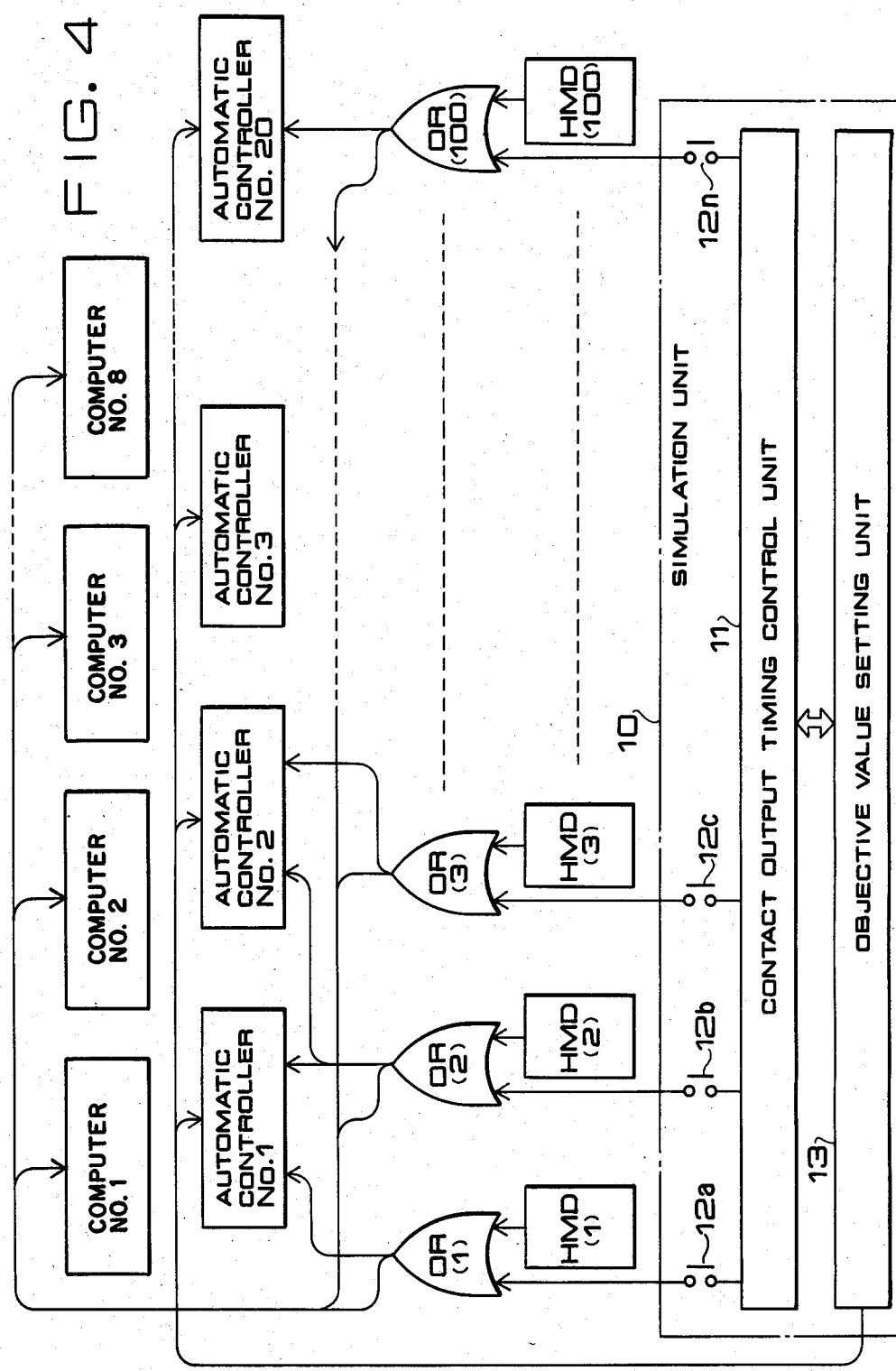
FIG. 4 is a block diagram of a simulation system according to the present invention.

Preferred embodiments of the present invention will be described hereinafter in connection with the accompanying drawings. Referring to FIG. 4, a simulation system 10 basically comprises a contact output timing control unit 11, contacts 12a, 12b, 12c, ... and 12n and an objective value setting unit 13. The contact output timing control unit 11 decides the ON-OFF timing of simulation signals corresponding to the output signal of each HMD according to a method which will be described afterward to operate the contacts 12a, 12b, ... and 12n automatically. The contacts 12a, 12b, ... and 12n and the HMDs Nos. 1 to 100, for instance, are connected to OR gates Nos. 1 to 100 respectively. The output signals of the OR gates are supplied to the relevant ones of the computers Nos. 1 to 8 and automatic controllers Nos. 1 to 20. Thus, when the contacts 12a, 12b, ... and 12n are operated by the simulation system 10 to give simulation signals simulating the operation of the HMDs, the computers Nos. 1 to 8 and the automatic controllers Nos. 1 to 20 execute their control functions as if they are executing their control functions according to signals given by the HMDs, so that the simulated control actions of the computers and the automatic controllers are carried out.

As mentioned earlier, the automatic controllers Nos. 1 to 20 are set for the respective objective values in a predetermined time sequence usually by the computers Nos. 1 to 8. Generally, plant controllers, i.e., the automatic controllers, and the computers are different from each other in the time of manufacture and test by the manufacturers and the time of installation, test and adjustment by the user, and thereby it is usual that the test and the adjustment of the automatic controllers precede that of the computers. In such a case, the computers cannot set the automatic controllers for objective values, and hence the functional confirmation of the complete automatic operation cannot be attained. In order to overcome such a disadvantage, the simulation system 10 is provided with the objective value setting unit 13 connected to the contact output timing control unit 11. The objective value setting unit 13 instead of the automatic controllers Nos. 1 to 20 and the computers Nos. 1 to 8 are set for the objective values in a predetermined time sequence, which enables the simulation of the automatic control functions of the total system without using the computers.

In this system, if the objective values provided by the objective value setting unit 13 for the automatic controllers Nos. 1 to 20 are fixed for every simulation test, the screw down device of a rolling mill is held at a fixed position and does not perform a screw-gap setting operation, and hence the confirmation of the automatic control functions is impossible. Therefore, several objective values are used alternately or in optional combination for the effective simulation of the control functions.

Naturally, if the computers are capable of being tested and adjusted, the objective value setting unit 13 is withheld from functioning and the automatic controllers are set for the original objective values by the computers for simulation.

Figure 5:
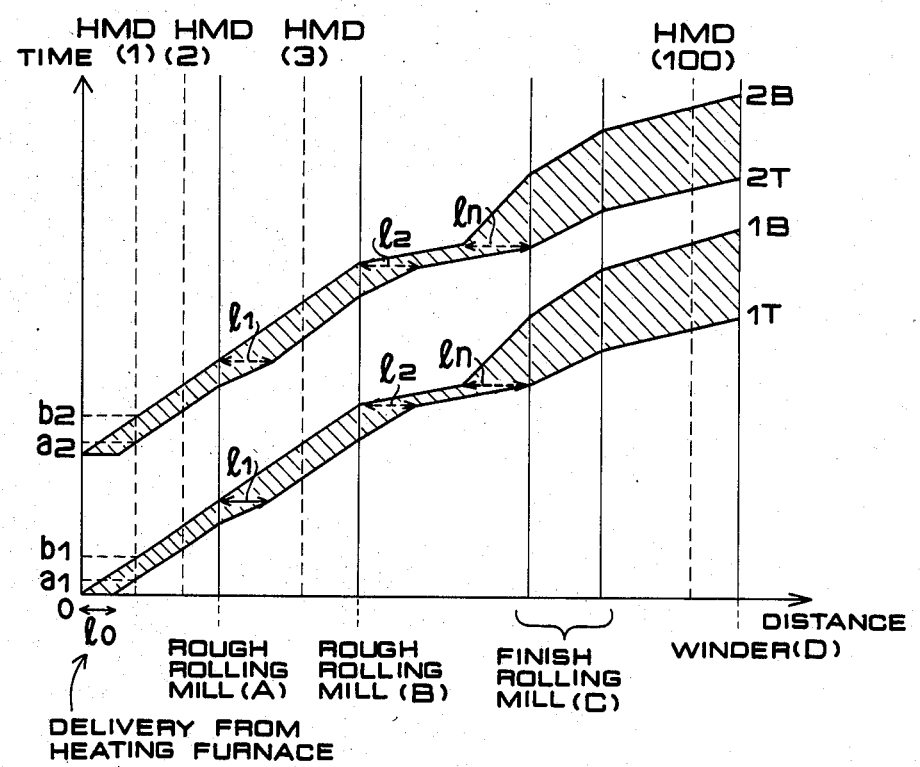
FIGS. 5 to 7 are timing charts showing the timings in which a slab passes the processes.

The functions of the contact output timing control unit 11 will be described hereinafter. FIG. 5 shows a time chart for processing two pieces of slabs through a series of processes from the delivery of the slab from the heating furnace (slab appearance) to the winding of the rolled slab by the winder (slab disappearance), in which the axis of abscissa is for distance from the heating furnace and the axis of ordinate is for time. In FIG. 5, the shaded parts indicate the slabs respectively. In FIG. 5, a curve 1T corresponds to the front end of the first slab and a curve 1B corresponds to the tail end of the same, while curves 2T and 2B correspond to the front end and the tail end of the second slab respectively. A time when the first slab is delivered from the heating furnace corresponds to the origin of the coordinates. The character $l_0$ represents the length of the slab as delivered from the heating furnace. The slabs are moved with time through rough rolling mills A and B and a finish rolling mill C toward a winder D while being extended in length sequentially as indicated by characters $l_1, l_2, \ldots$ and $l_n$. The second slab is processed through the same processes as the first slab. The HMDs are disposed at predetermined positions between the heating furnace and the winder D.

Figure 6:
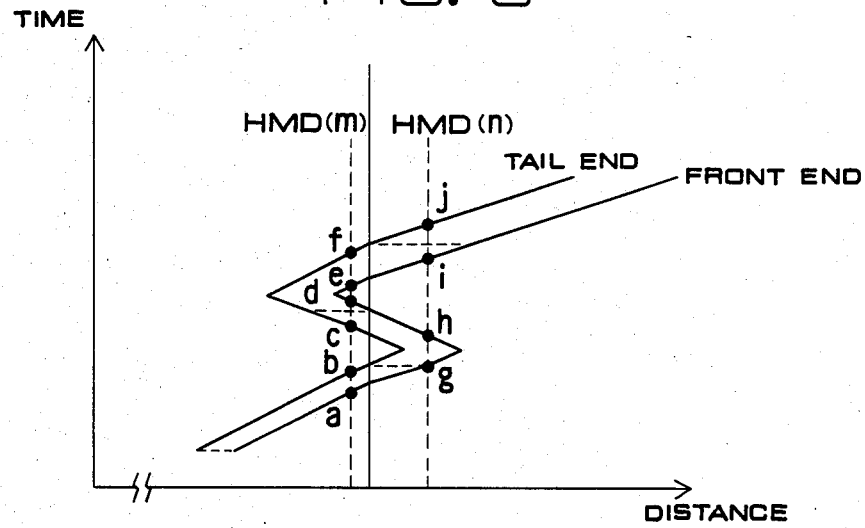
Figure 7:
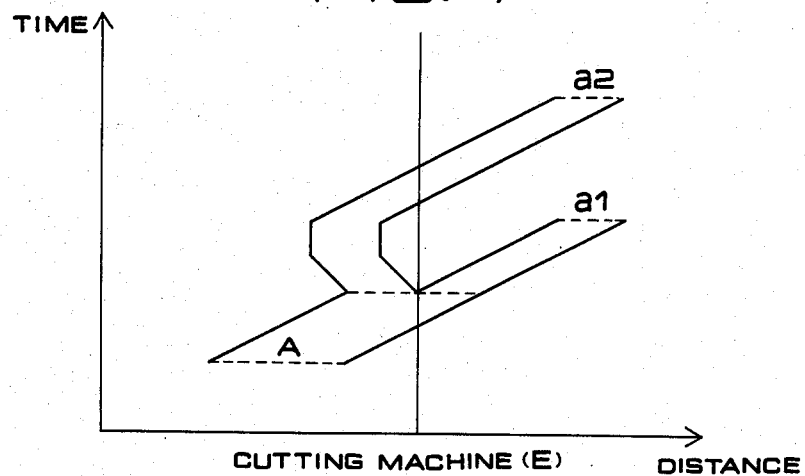

The HMD No. 1, for instance, is put to ON-position at a time a1 when the front end of the first slab passes by the HMD No. 1 and is put to OFF-position at a time b1 when the tail end of the first slab passes by the HMD No. 1. Other HMDs are actuated in the same manner. In a reversible rolling operation as shown in FIG. 6, the HMD No. m repeats ON-OFF operation at times a→b, c→d and e→f, while the HMD No. n repeats ON-OFF operation at times g→h and i→j. FIG. 7 shows a time chart for an exemplary process provided with a cutting machine E, in which a slab A is cut into two slabs al and a2 by the cutting machine E.

As described hereinbefore, once the respective positions of the HMDs and the slab rolling pattern are decided, the ON-OFF timing of each HMD is decided. Setting the contact output timing control unit 11 for the ON-OFF timing pattern enables the HMDs to give simulation ON-OFF signals according to the rolling pattern. Consequently, automatic simulation is carried out. When the contact output timing control unit 11 is set for HMD ON-OFF timing pattern corresponding to a plurality of optional rolling patterns, automatic simulation of a combination of optional rolling patterns can be carried out for the first, second, ... and nth slabs.

Basically, the simulation system of the above-mentioned constitution is capable of functioning satisfactorily. However, the above-mentioned simulation system is of a pattern system and is incapable of copying with the change of the predetermined rolling pattern. That is, if an operator, for example, stops or reverses a table operating under automatic control for carrying a slab, namely, if the automatic operation of the rolling system is interrupted by manual interference, the advancement of the slab deviates from the predetermined rolling pattern. Therefore, a further improved simulation system as will be described hereinafter is needed.

Figure 8:
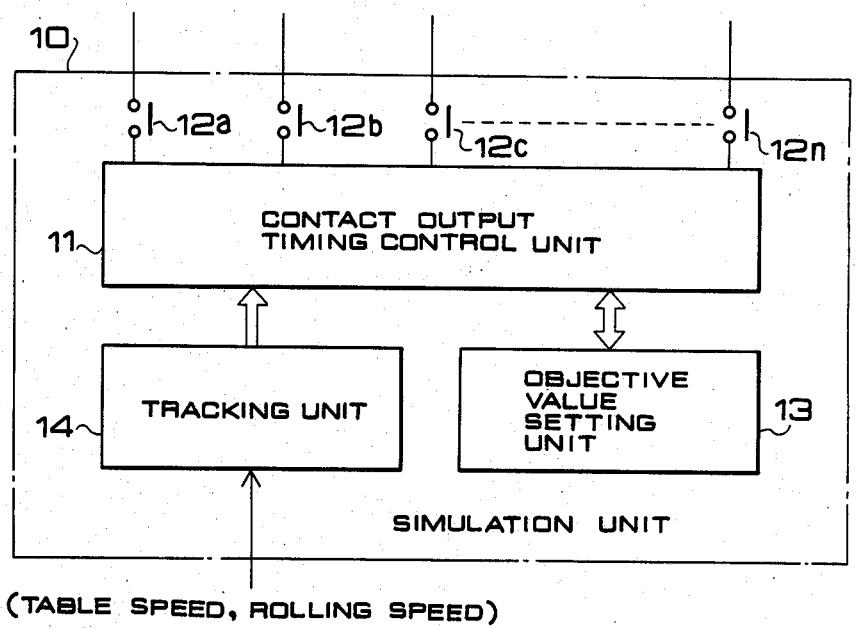
FIG. 8 is a block diagram of another simulation system according to the present invention.

The advanced simulation system is of a different system which may be called a tracking system. As shown in FIG. 8, this simulation system includes a tracking unit 14 and is adapted to take the conveying speeds of the tables and the rolling speeds of the rolling mills into account for simulation. In this simulation system of a tracking system, the initial length of the slab and the draft ratios of the rolling mills are given to the tracking unit 14 to track continuously the front end and the tail end of the imaginary slab after the time of appearance of the imaginary slab. In tracking the imaginary slab, the speed of the table or the rolling speed of the rolling mill is changed-over sequentially as the imaginary slab advances, and thereby it is possible to track the imaginary slab according to the actual operation of the tables and the rolling mills both in the automatic control mode and in the manually interrupted automatic control mode. If the positions of the front end and the tail end of the imaginary slab are stored in the tracking unit 14, it is obvious from FIGS. 5 and 6 that the operation of each HMD can readily be regulated to control the operation of the contacts 12a, 12b, . . . and 12n. Accordingly, this advanced simulation system is capable of extremely satisfactorily simulating practical rolling conditions including manually interrupted automatic rolling operation and irregular rolling operation.

The advanced simulation system of a tracking system, as well as the simulation system of a pattern system, is capable of performing the simulation of various combinations of optical rolling patterns by changing the set values of the initial length and the draft ratio for slabs.

Furthermore, in the description of the simulation system in connection with FIG. 5, the range of simulation is from the delivery from the heating furnace to the winder, however, it is also possible to simulate the rolling operation in stages, namely, a first stage of rolling operation in a range from the heating furnace to the rough rolling mill B and a second stage of rolling operation in a range from the rough rolling mill B to the winder D, in which the positions of slab appearance and slab disappearance in the first stage are the delivery from the heating furnace and the completion of rolling (delivery of the tail end) on the rough rolling mill B respectively, while the positions of slab appearance and slab disappearance in the second stage are the start of rolling operation on the rough rolling mill B and the winder D respectively.

Figure 1:
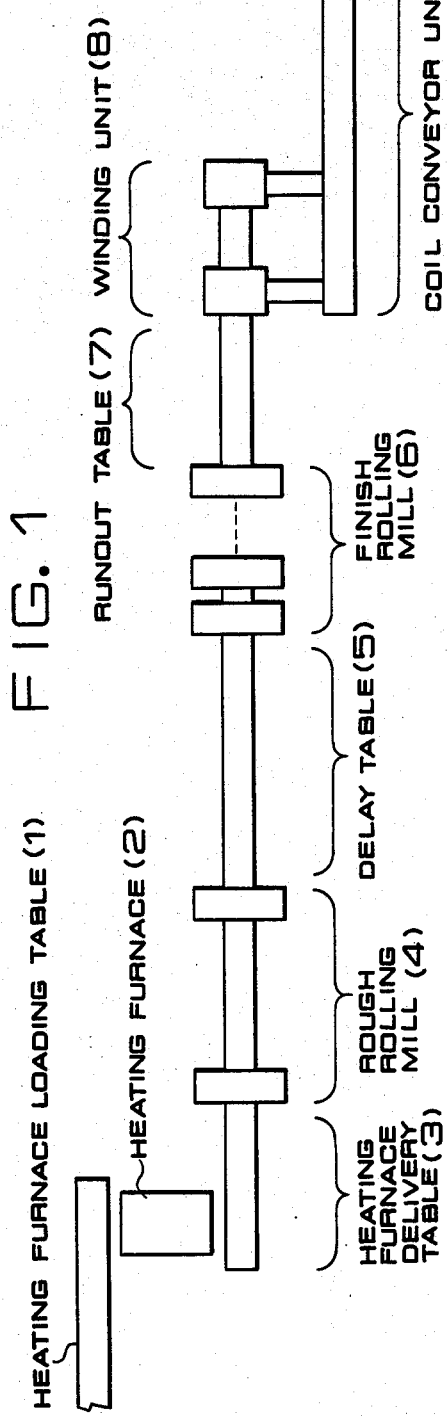
FIG. 1 is a schematic plan view of a rolling line to which a simulation system is applied.
Figure 2:
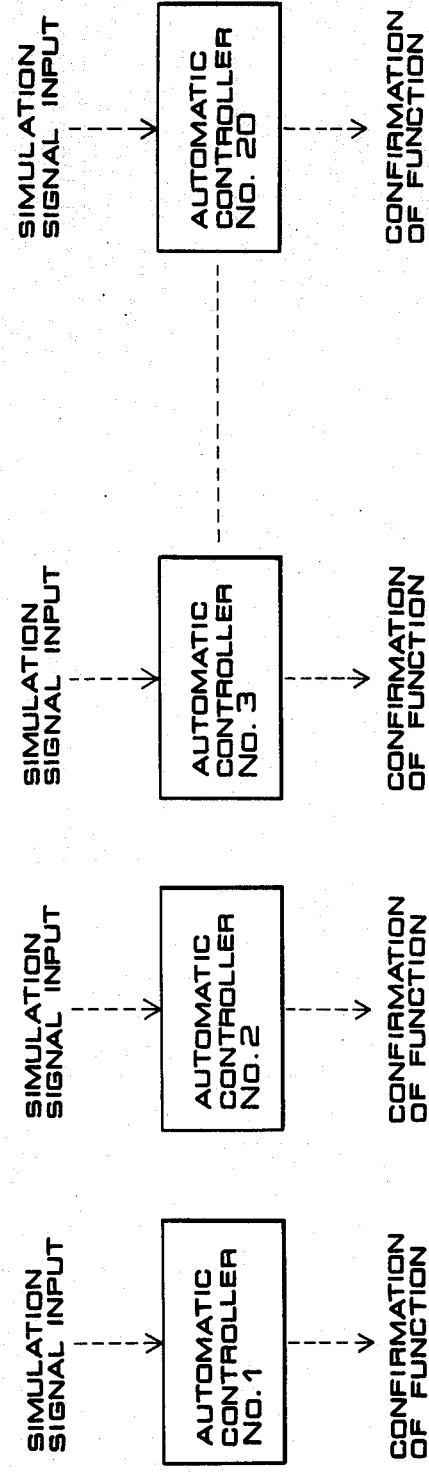
FIG. 2 is a diagram showing the conception of the operating principle of a conventional simulation system for the rolling line of FIG. 1.
Figure 3:
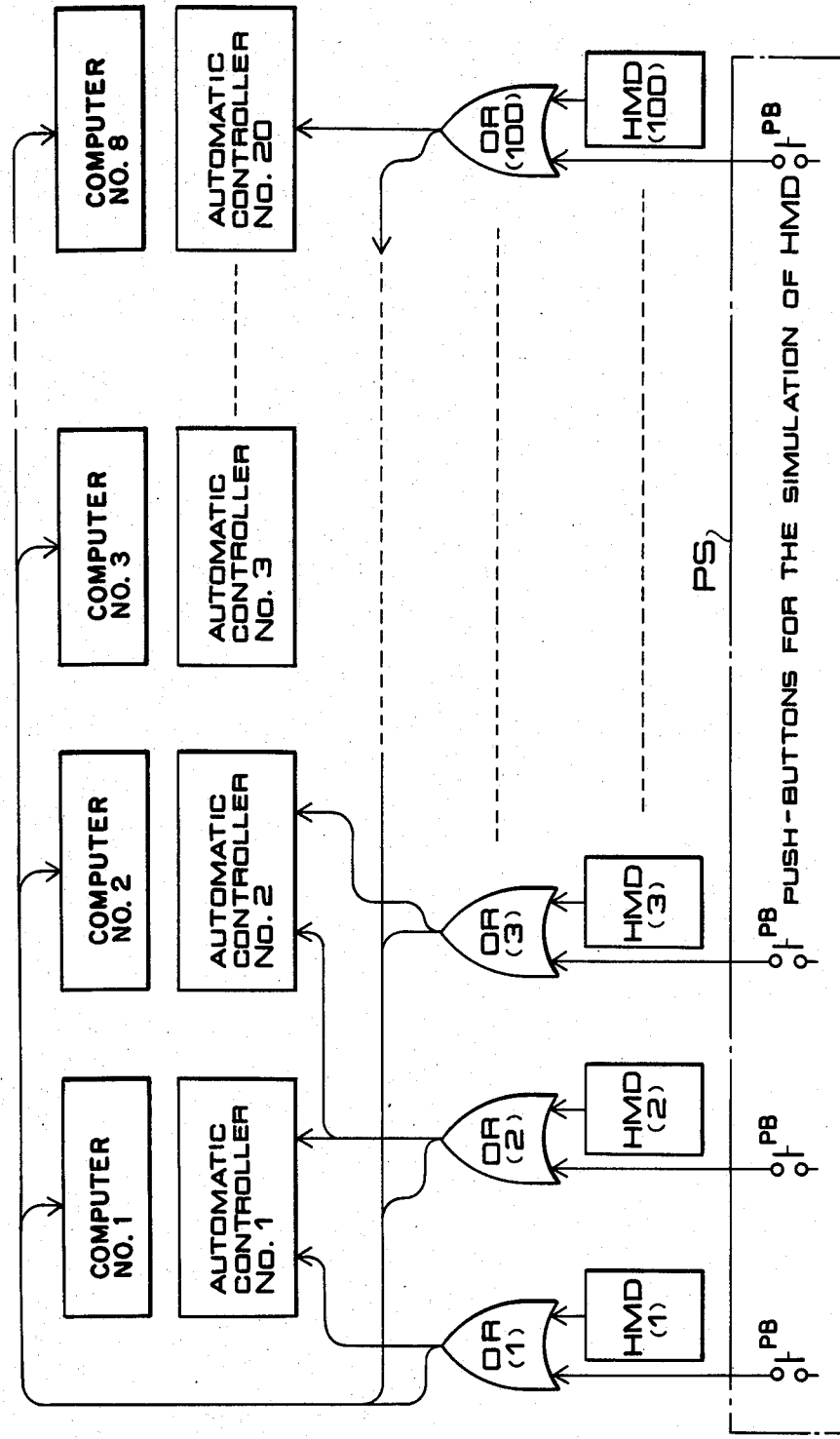
FIG. 3 is a block diagram of a conventional simulation system.

It is also possible to include a coil conveyor arranged after the winder D in the range of simulation (FIG. 1). Optional ranges of simulation can be simulated individually or in parallel by dividing a range of simulation into an optional number of subranges or connecting optional number of ranges of simulation for efficient simulation.

Furthermore, the control actions of the computers or the automatic controllers can surely be confirmed by providing the simulation system with a function to interrupt and then to restart (to continue) the advancement of the imaginary slab automatically or manually at a predetermined position or an optional position. For example, in FIG. 5, when the computer calculates an objective value for the rolling mill A and gives the objective value to the automatic controller at a time when HMD No. 1 is put to ON-position and the automatic controller gives command to start the rolling operation of the rolling mill A at a time when HMD No. 2 is put to ON-position, the results of calculating the objective value for the rough rolling mill A by the computer and the function of the computer to give the objective value to the automatic controller can surely be confirmed by interrupting the advancement of the imaginary slab immediately after the HMD No. 1 has been put to ON-position. Then, the function of the automatic controller to restart the rolling operation of the rough rolling mill A according to the objective value can be confirmed by restarting the advancement of the imaginary slab and then interrupting the advancement of the imaginary slab again immediately after the HMD No. 2 has been put to ON-position. After the function of the automatic controller has thus been confirmed, the advancement of the imaginary slab is restarted to continue the simulation thereafter. Generally, a rolling mill performs various automatic operations successively, and hence it is difficult in an ordinary state to confirm within a short period of time whether or not each function is performed surely. Accordingly, the function of temporarily interrupting the rolling operation of a rolling mill as mentioned above is quite effective for the confirmation of the individual functions.

The HMDs employed in the embodiments as described hereinbefore represent general detectors capable of detecting the existence of a slab and they may be photorelays, cold metal detectors (CMD), laser sensors, coil touch sensors, detectors for detecting the contact or over filling of a rolling mill or plate detectors such as width gauge and thickness gauge. Furthermore, the table speed and the rolling speed which are given to the tracking unit 14 may be the corresponding signals fed back to the tracking unit 14 from the rolling line or may be the corresponding reference speed signals given by the controllers.

Although the invention has been described with reference to the embodiments thereof as applied to a hot rolling system by way of example, the present invention is not limited thereto and is applicable to other hot rolling systems, plate rolling systems, cold rolling systems, carrying systems and various other systems for form rolling, processing, cutting and carrying.

Thus, according to the present invention, four kinds of simulations can be carried out by the combination of two contact output timing control systems for simulating the operation of the HMDs, i.e., a pattern system and a tracking system, and the use or the nonuse of a function as an alternative to a function of applying an objective value given by a computer to an automatic controller. Such a function of the simulation system of the present invention is applicable to the efficient, appropriate and correct simulation of operations in the test of a machine by the manufacturer, the general test operation of a machine by the user and daily simulation test during the commercial operation of the machine according to the purposes. Thus the simulation system of the present invention enables the full confirmation of the computers and automatic controllers of a machine prior to the practical operation of the machine. The simulation system of the present invention is able also to simulate operations for processing various kinds of materials almost in the same mode as the practical operations to confirm the control actions of the computers and the automatic controllers. It is apparent from what has been described hereinbefore that even a simulation system capable of performing only one of those four simulation modes is fully applicable to practical simulation.

What is claimed is:

1. A simulation system for a work processing system having work processing equipments, a plurality of work detectors for detecting the existence of the work, and a plurality of computers and automatic controllers responsive to intrinsic work detection signals given by the work detectors for controlling the work processing equipments sequentially in a predetermined order; comprising a simulation unit having a simulation mode providing real-time simulation of imaginary work processing operations, a signal generating unit for giving simulation signals corresponding to the ON-OFF signals of the work detectors according to the simulation mode of the simulation unit, and a circuit providing the logical sum of the intrinsic work detection signals and the simulation signals of the work detectors; wherein the computers and the automatic controllers are actuated for the real-time simulation of the control actions by the simulated signals corresponding to the work detection signals of the work detectors; and wherein said simulation unit has means for providing a single or a plurality of predetermined simulation patterns and giving simulation signals of the work detectors according to one of the simulation patterns or a combination of those simulation patterns.

2. A simulation system for a work processing system having work processing equipments, a plurality of work detectors for detecting the existence of the work, and a plurality of computers and automatic controllers responsive to intrinsic work detection signals given by the work detectors for controlling the work processing equipments sequentially in a predetermined order; comprising a simulation unit having a simulation mode providing real-time simulation of imaginary work processing operations, a signal generating unit for giving simulation signals corresponding to the ON-OFF signals of the work detectors according to the simulation mode of the simulation unit, and a circuit providing the logical sum of the intrinsic work detection signals and the simulation signals of the work detectors; wherein the computers and the automatic controllers are actuated for the real-time simulation of the control actions by the simulation signals corresponding to the work detection signals of the work detectors; and wherein said simulation unit has means to give simulation signals simulating the operation of the work detectors on the basis of the results of calculation of the positions of the front end and the tail end of the imaginary work by simulating the processing operation such as rolling using the work processing speed of the work processing system.

3. A simulation system for a work processing system having work processing equipments, a plurality of work detectors for detecting the existence of the work, and a plurality of computers and automatic controllers responsive to intrinsic work detection signals given by the work detectors for controlling the work processing equipments sequentially in a predetermined order; comprising a simulation unit having a simulation mode providing real-time simulation of imaginary work processing operations, a signal generating unit for giving simulation signals corresponding to the ON-OFF signals of the work detectors according to the simulation mode of the simulation unit, and a circuit providing the logical sum of the intrinsic work detection signals and the simulation signals of the work detectors; wherein the computers and the automatic controllers are actuated for the real-time simulation of the control actions by the simulation signals corresponding to the work detection signals of the work detectors; and wherein said simulation unit simulates an operating mode in which a plurality of imaginary works of the same pattern or different patterns are processed simultaneously.

4. A simulation system for a work processing system having work processing equipments, a plurality of work detectors for detecting the existence of the work, and a plurality of computers and automatic controllers responsive to intrinsic work detection signals given by the work detectors for controlling the work processing equipments sequentially in a predetermined order; comprising a simulation unit having a simulation mode providing real-time simulation of imaginary work processing operations, a signal generating unit for giving simulation signals corresponding to the ON-OFF signals of the work detectors according to the simulation mode of the simulation unit, and a circuit providing the logical sum of the intrinsic work detection signals and the simulation signals of the work detectors; wherein the computers and the automatic controllers are actuated for the real-time simulation of the control actions by the simulation signals corresponding to the work detection signals of the work detectors; and wherein said simulation unit simulates the total range of the processing operation sequentially and continuously, simulating a plurality of the subranges of the processing operation individually, simulating a connection of those subranges of the processing operation or simulating a plurality of those subranges or a plurality of combinations of the subranges of the processing operation simultaneously.

5. A simulation system for a work processing system having work processing equipments, a plurality of work detectors for detecting the existence of the work, and a plurality of computers and automatic controllers means responsive to intrinsic work detection signals given by the work detectors for controlling the work processing equipments sequentially in a predetermined order; comprising a simulation unit having a simulation mode providing real-time simulation of imaginary work processing opertions, a signal generating unit for giving simulation signals corresponding to the ON-OFF signals of the work detectors according to the simulation mode of the simulation unit, and a circuit providing the logical sum of the intrinsic work detection signals and the simulation signals of the work detectors; wherein the computers and the automatic controllers are actuated for the real-time simulation of the control actions by the simulation signals corresponding to the work detection signals of the work detectors; and wherein said simulation unit has means to stop the imaginary work processing operation automatically or manually at a predetermined position or at an optional position, and then restarting the processing operation automatically or manually.

6. A simulation system for a work processing system having work processing equipments, a plurality of work detectors for detecting the existence of the work, and a plurality of computers and automatic controllers responsive to intrinsic work detection signals given by the work detectors for controlling the work processing equipments sequentially in a predetermined order; comprising a simulation unit having a simulation mode providing real-time simulation of imaginary work processing operations, a signal generating unit for giving simulation signals corresponding to the ON-OFF signals of the work detectors according to the simulation mode of the simulation unit, and a circuit providing the logical sum of the intrinsic work detection signals and the simulation signals of the work detectors; wherein the computers and the automatic controllers are actuated for the real-time simulation of the control actions by the simulation signals corresponding to the work detection signals of the work detectors; and wherein said simulation unit has a setting unit which gives objective values required by said automatic controllers for controlling the work processing system to said automatic controllers at predetermined timings to make said automatic controllers execute the real-time simulation of their control actions.

7. A simulation system according to claim 6, wherein said setting unit has a plurality of patterns of objective values, and has means for employing said patterns alternately or in combination and gives said objective values to the automatic controllers.

* * * * *